(12) United States Patent
Matsuoka et al.

(10) Patent No.: US 12,202,684 B2
(45) Date of Patent: Jan. 21, 2025

(54) ROBOT, AND SUBSTRATE TRANSPORTATION SYSTEM COMPRISING THE SAME

(71) Applicant: Kawasaki Jukogyo Kabushiki Kaisha, Kobe (JP)

(72) Inventors: Junichi Matsuoka, Kobe (JP); Masaru Yamasaki, Kobe (JP); Yuichiro Tanaka, Kobe (JP)

(73) Assignee: KAWASAKI JUKOGYO KABUSHIKI KAISHA, Kobe (JP)

( * ) Notice: Subject to any disclaimer, the term of this patent is extended or adjusted under 35 U.S.C. 154(b) by 305 days.

(21) Appl. No.: 17/797,446

(22) PCT Filed: Feb. 2, 2021

(86) PCT No.: PCT/JP2021/003670
§ 371 (c)(1),
(2) Date: Aug. 4, 2022

(87) PCT Pub. No.: WO2021/157553
PCT Pub. Date: Aug. 12, 2021

(65) Prior Publication Data
US 2023/0084971 A1 Mar. 16, 2023

(30) Foreign Application Priority Data
Feb. 7, 2020 (JP) ................................. 2020-019880

(51) Int. Cl.
*B65G 47/90* (2006.01)
(52) U.S. Cl.
CPC .................................. *B65G 47/90* (2013.01)

(58) Field of Classification Search
None
See application file for complete search history.

(56) References Cited

U.S. PATENT DOCUMENTS

| | | | |
|---|---|---|---|
| 7,874,782 B2* | 1/2011 | Hashimoto | ....... H01L 21/67766 414/217 |
| 10,276,416 B2* | 4/2019 | Kitahara | .......... H01L 21/67781 |
| 11,167,419 B2* | 11/2021 | Harada | ............. H01L 21/68707 |
| 11,404,295 B2* | 8/2022 | Minamida | ......... H01L 21/67017 |
| 2016/0136818 A1 | 5/2016 | Kitahara et al. | |
| 2019/0252223 A1 | 8/2019 | Minamida et al. | |
| 2020/0016755 A1 | 1/2020 | Harada et al. | |

FOREIGN PATENT DOCUMENTS

| | | |
|---|---|---|
| CN | 105378908 B | 7/2018 |
| CN | 110137121 A | 8/2019 |
| CN | 110712195 A | 1/2020 |
| JP | H04-102794 U | 9/1992 |
| JP | H10-303588 A | 11/1998 |
| JP | 2013-157561 A | 8/2013 |
| JP | 2019-140379 A | 8/2019 |
| JP | 2020-11303 A | 1/2020 |

* cited by examiner

*Primary Examiner* — Michael S Lowe
(74) *Attorney, Agent, or Firm* — XSENSUS LLP

(57) ABSTRACT

A robot 100 includes a base 1 having side portions, an arm 3 rotatably coupled to the base 1, and a hand 8 coupled to the arm 3. A joint between the arm 3 and the base 1 is closest to a first side portion 11a in a plan view. The base 1 houses control components. A second side portion 11b is provided with a maintenance area 12 on which a maintenance component such as a first board 24 is disposed. The maintenance area 12 is used for maintenance of the maintenance component.

13 Claims, 5 Drawing Sheets

ROBOT, AND SUBSTRATE TRANSPORTATION SYSTEM COMPRISING THE SAME

CROSS-REFERENCE TO RELATED APPLICATIONS

The present application is based on PCT filing PCT/JP2021/003670, filed Feb. 2, 2021, which claims priority to JP 2020-019880, filed Feb. 7, 2020, the entire contents of each are incorporated herein by reference.

FIELD

The technique disclosed here relates to a robot and a substrate transfer system including the robot.

BACKGROUND

There has been known a robot including a base, an arm, and an end effector. Patent Document 1, for example, discloses a robot that includes a base, an arm rotatably coupled to the base, and an end effector coupled to the arm and is disposed in a casing. In this robot, part of the base is located outside the casing. Accordingly, the portion of the base located outside the casing has enhanced maintainability.

CITATION LIST

Patent Document

Patent Document 1: Japanese Patent Application Publication No. 2013-157561

SUMMARY

Technical Problem

As described above, a robot is used while being disposed inside a casing or the like in some cases. In such cases, the casing or the like has a limited space, and thus, maintenance of the robot is difficult.

A possible measure for enhancing maintainability is to dispose a part of a robot outside a casing as described in Patent Document 1, but there is still room for enhancement of maintainability in the limited space such as in the casing, for example.

It is therefore an object of the present disclosure to enhance maintainability of a robot in a limited space.

A robot disclosed here includes: abase having side portions; an arm rotatably coupled to the base; and an end effector coupled to the arm. A joint between the arm and the base is closest to a first side portion in a plan view, and the first side portion is one of the side portions. The base houses components related to control of at least one of the arm or the end effector. A second side portion that is not parallel to the first side portion of the side portions is provided with a maintenance area on which at least one of the components is disposed, the maintenance area being for maintenance of the at least one of the components.

A substrate transfer system disclosed here includes: a casing; and a robot disposed in the casing and configured to transfer a substrate. The casing includes a first side wall and a third side wall opposed to each other in a predetermined first direction, and a second side wall and a fourth side wall opposed to each other in a second direction different from the first direction. The second side wall is provided with an opening/closing part for maintenance on the robot. The robot includes a base having side portions, an arm rotatably attached to the base, and an end effector coupled to the arm. The base houses components related to control of at least one of the arm or the end effector, and is closer to the first side wall than the third side wall. A first side portion that is one of the side portions of the base faces the first side wall. A second side portion facing the second side wall of the side portions of the base is provided with a maintenance area on which at least one of the components is disposed, and the maintenance area is for maintenance of at least one component.

The robot can enhance maintainability of the robot in a limited space.

The substrate transfer system can enhance maintainability of the robot in a limited space.

DESCRIPTION OF EMBODIMENTS

An exemplary embodiment will be described in detail hereinafter with reference to the drawings.

Figure 1:
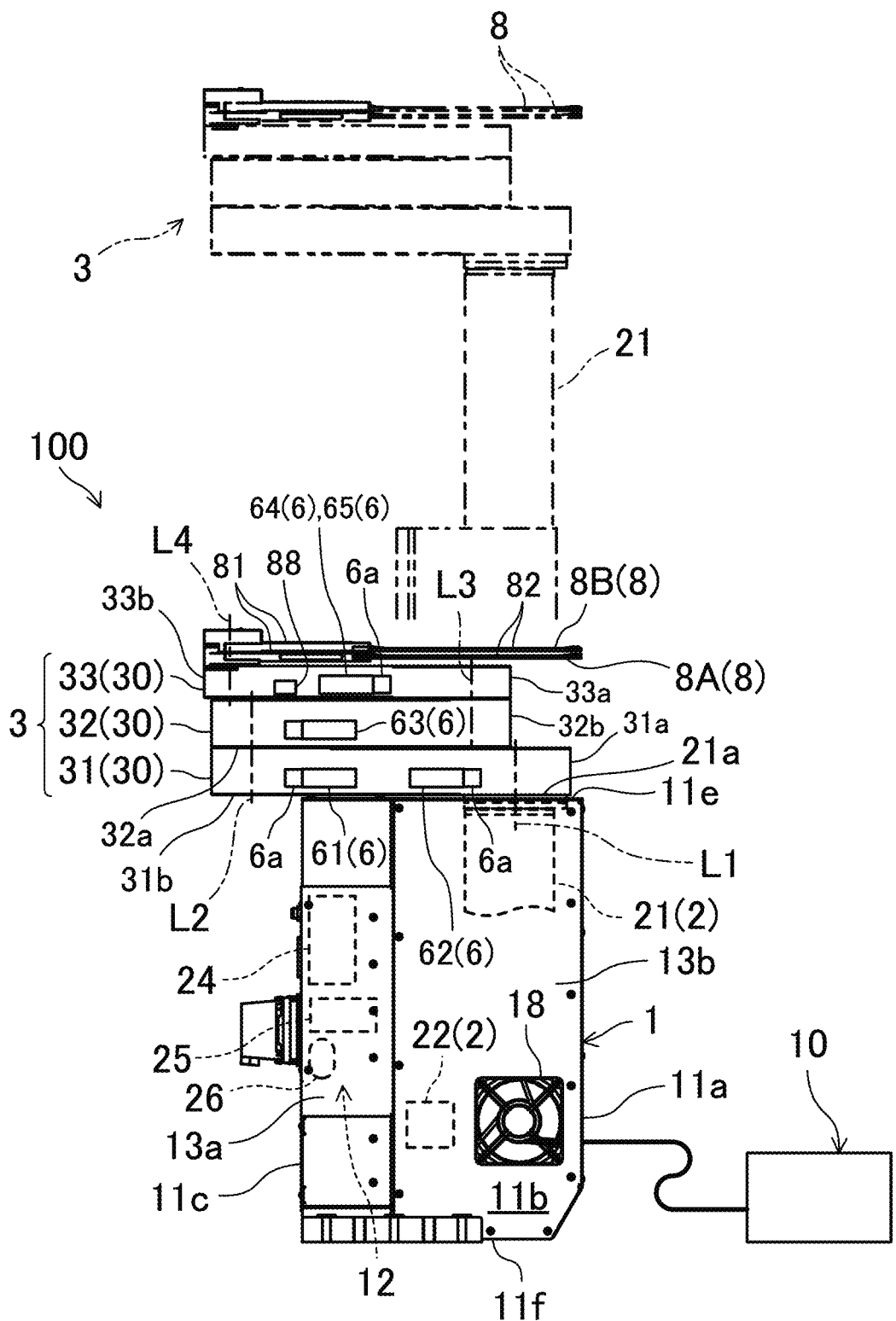
FIG. 1 is a side view of a horizontal articulated robot.
Figure 2:
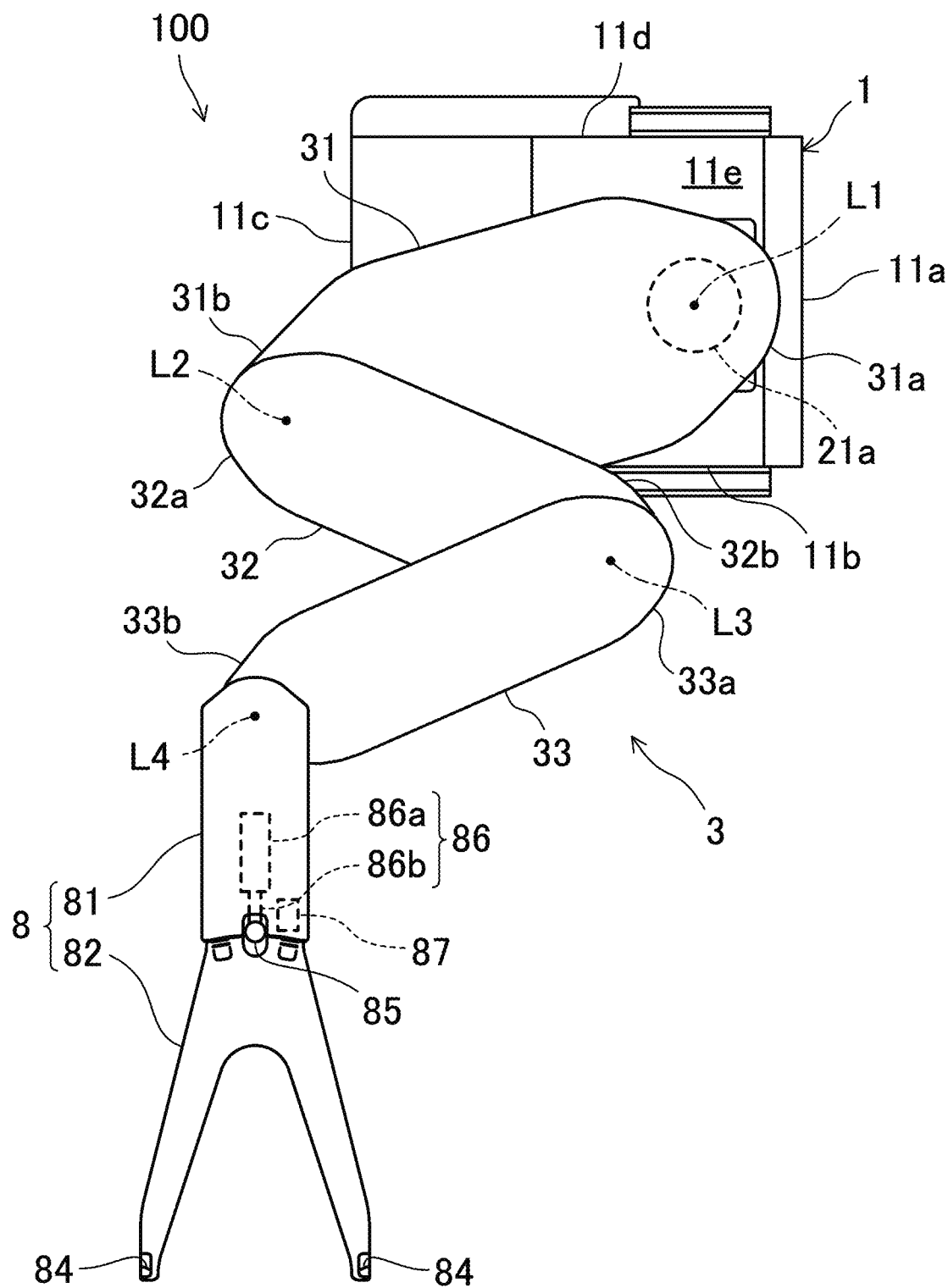
FIG. 2 is a plan view of the horizontal articulated robot.

FIG. 1 is a side view of a horizontal articulated robot 100. FIG. 2 is a plan view of the horizontal articulated robot 100. The horizontal articulated robot (hereinafter referred to as a "robot") 100 is a robot of a selective compliance assembly robot arm (SCARA) type. The robot 100 includes a base 1, an arm 3 coupled to the base 1 to be rotatable horizontally, and hands 8 coupled to the arm 3 to be rotatable horizontally. The arm 3 is coupled to the base 1 to be rotatable horizontally, that is, rotatable about a first axis L1 extending vertically. The arm 3 is formed by links 30 coupled to one another to be rotatable horizontally. The hands 8 are coupled to the arm 3 to be rotatable horizontally. The hands 8 hold an object. The object is, for example, a substrate S. The robot 100 is an example of a robot. The hands 8 are an example of end effectors. The robot 100 also includes a control device 10 that controls the entire robot 100.

Figure 3:
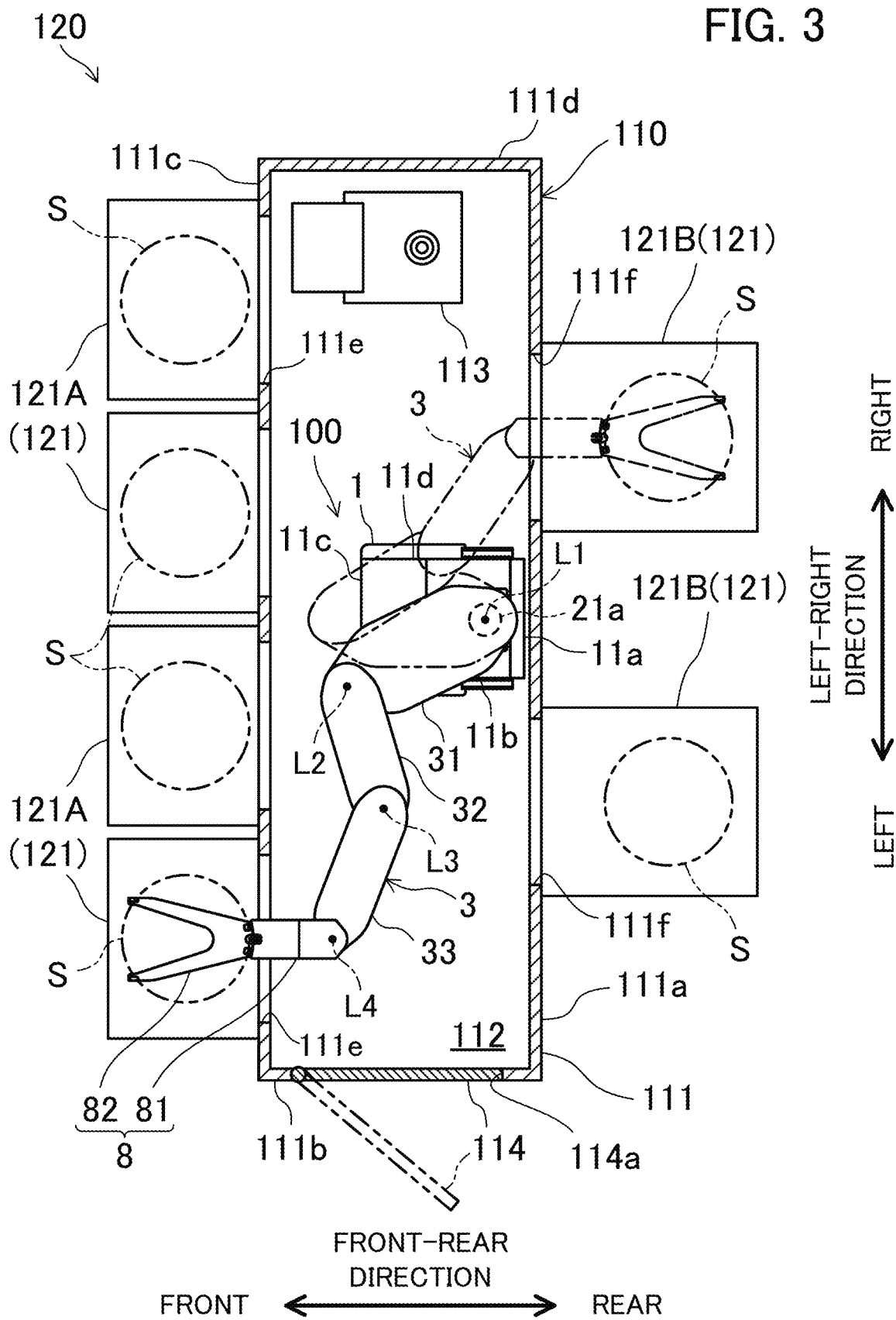
FIG. 3 is a plan view schematically illustrating a substrate processing apparatus.
Figure 4:
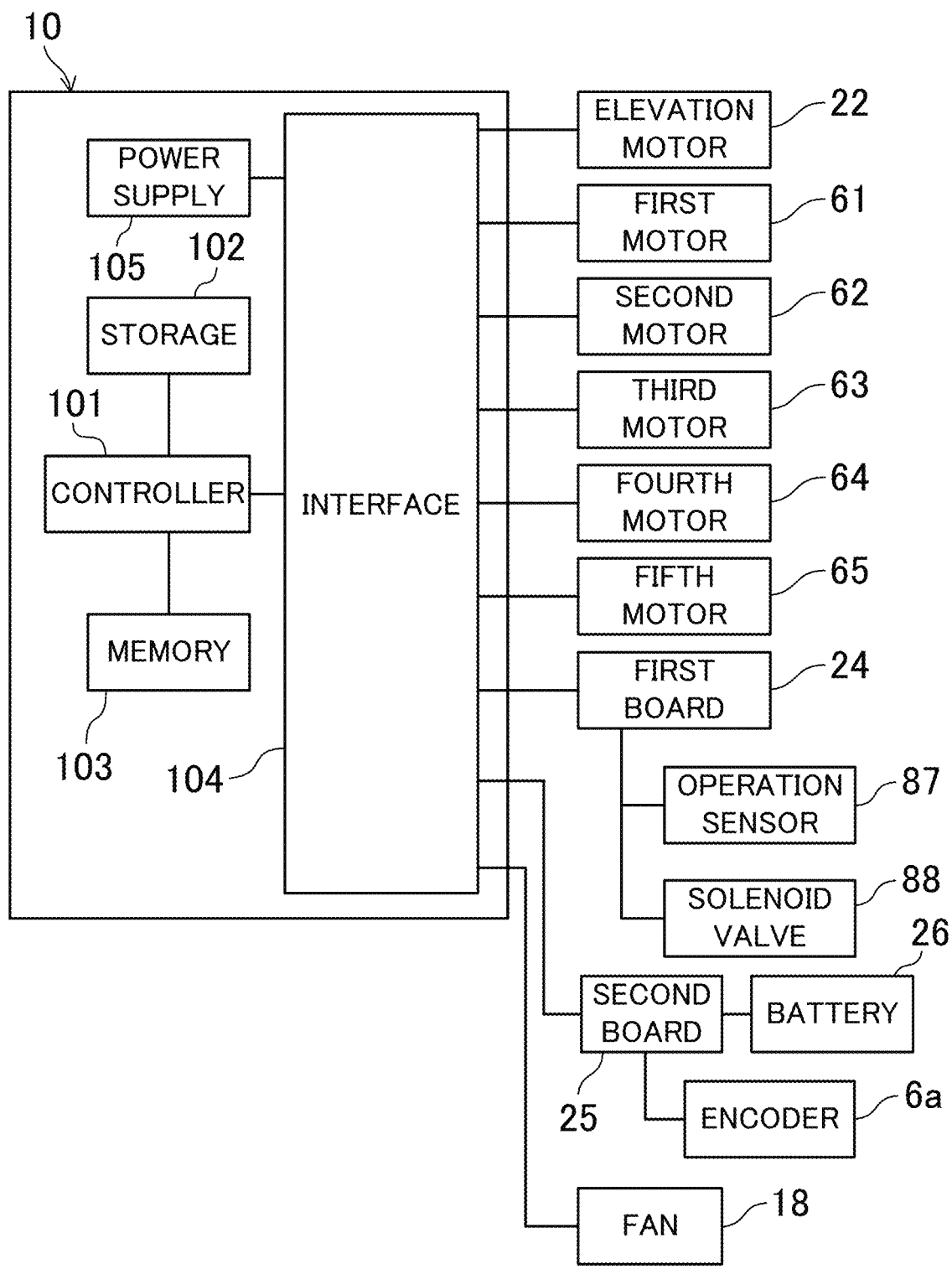
FIG. 4 is a functional block diagram of the robot.

FIG. 3 is a plan view schematically illustrating a substrate processing apparatus 120. The robot 100 is incorporated in, for example, a substrate transfer system 110 for transferring a substrate S. The substrate transfer system 110 includes a casing 111 and the robot 100. For example, the substrate transfer system 110 is an equipment front end module (EFEM). The substrate transfer system 110 conforms to a semiconductor equipment and materials international (SEMI) standard. The substrate transfer system 110 may conform to another standard other than the SEMI standard.

A transfer space 112 is formed in the casing 111. The robot 100 is disposed in the casing 111, that is, in the transfer space 112. The robot 100 transfers the substrate S in the transfer space 112. The substrate S is, for example, a disc-shaped semiconductor wafer. The transfer space 112 is cleaned. An ambient gas filling the transfer space 112 is adjusted with, for example, a fine filter unit. The transfer space 112 is provided with an aligner 113 for positioning the substrate S.

The casing 111 includes a first side wall 111a and a third side wall 111c opposed to each other in a predetermined first direction, and a second side wall 111b and a fourth side wall 111d opposed to each other in a second direction different from the first direction. The first direction and the second direction intersect with each other. More specifically, the first direction and the second direction are orthogonal to each other. Hereinafter, for convenience of description, the first direction will be referred to as a "front-rear direction" and a second direction will be referred to as a "left-right direction." Each of the front-rear direction and the left-right direction is orthogonal to a top-bottom direction. The first side wall 111a and the second side wall 111b are adjacent to each other. The second side wall 111b and the third side wall 111c are adjacent to each other. The third side wall 111c and the fourth side wall 111d are adjacent to each other. The fourth side wall 111d and the first side wall 111a are adjacent to each other. The casing 111 is a quadrilateral, more specifically a rectangle, in a plan view.

A distance between the second side wall 111b and the fourth side wall 111d is larger than a distance between the first side wall 111a and the third side wall 111c. That is, the casing 111 has a substantially rectangular shape elongated in the left-right direction rather than the front-rear direction in a plan view.

The casing 111 also includes a ceiling wall (not shown) and a bottom wall (not shown) opposed to each other in the top-bottom direction. The casing 111 has a substantially rectangular parallelepiped shape.

For example, the substrate transfer system 110 is incorporated in the substrate processing apparatus 120. The substrate processing apparatus 120 includes the substrate transfer system 110 and containers 121 each configured to house the substrate S. A container room is formed in each of the containers 121. The container room is cleaned. For example, each of the containers 121 includes a front opening unified pod (FOUP) 121A and a processor 121B. Each of the FOUPs 121A is an enclosure for the substrate S. The processor 121B processes the substrate S. The FOUPs 121A and the processors 121B are adjacent to the casing 111 at the outside of the casing 111. The FOUPs 121A are disposed to be adjacent to one of the first side wall 111a or the third side wall 111c, and the processors 121B are disposed to be adjacent to the other of the first side wall 111a and the third side wall 111c. Specifically, the FOUPs 121A are attached to the third side wall 111c with FOUP openers (not shown) interposed therebetween. The processors 121B are adjacent to the first side wall 111a. Each of the FOUPs 121A is an example of an enclosure for housing a semiconductor wafer.

Each of the FOUPs 121A is configured to house a substrate S before processing and a substrate S after processing. The FOUPs 121A are substrate enclosures for a mini-environment. Each FOUP 121A houses substrates S in a horizontal state such that the substrates S are spaced from one another in the vertical direction. In this example, four FOUPs 121A are provided. The four FOUPs 121A are arranged with regular intervals in the left-right direction. The third side wall 111c has openings 111e corresponding to the FOUPs 121A. The FOUP openers switch the connection state between the transfer space 112 and the internal spaces of the FOUPs 121A between connection and disconnection.

Each of the processors 121B is, for example, a processor that performs heat treatment, impurity introduction, thin-film formation, lithography, cleaning, planarization, or inspection of appearance or size on the substrates S. Alternatively, processing performed by each processor 121B may be temporary housing for transferring the substrates S. In this example, two processors 121B are provided. The first side wall 111a has openings 111f corresponding to the processors 121B. The openings 111f may be equipped with doors (not shown). The connection state between the transfer space 112 and the internal spaces of the processors 121B is switched between connection and disconnection by opening and closing the doors.

In such a configuration, the robot 100 included in the substrate transfer system 110 transfers semiconductor wafers between the FOUPs 121A for housing the semiconductor wafers and the processors 121B for processing the semiconductor wafers. Specifically, the hands 8 hold the semiconductor wafer as the substrate S. The arm 3 and the hands 8 transfer the semiconductor wafer between the FOUPs 121A and the processors 121B <Configuration of Robot 100>

A configuration of the robot 100 will be described with reference to FIGS. 1 and 2.

The base 1 has side portions (e.g., side surface). The side portions include at least a first side portion 11a and a second side portion 11b not parallel to the first side portion 11a. A direction in which the first side portion 11a faces (i.e., a direction normal to the first side portion 11a) and a direction in which the second side portion 11b faces (i.e., a direction normal to the second side portion 11b) intersect with each other. More specifically, the direction in which the first side portion 11a faces and the direction in which the second side portion 11b faces are orthogonal to each other. The side portions further include a third side portion 11c opposed to the first side portion 11a, and a fourth side portion 11d opposed to the second side portion 11b. The first side portion 11a is adjacent to the second side portion 11b. The second side portion 11b is adjacent to the third side portion 11c. The third side portion 11c is adjacent to the fourth side portion 11d. The fourth side portion 11d is adjacent to the first side portion 11a. The base 1 is a quadrilateral, more specifically a rectangle, in a plan view.

The base 1 also has a ceiling portion 11e and a bottom portion 11f in addition to the side portions. The base 1 has a substantially rectangular parallelepiped shape.

The base 1 is provided with an elevation mechanism 2 that lifts and lowers the arm 3 in the vertical direction. The elevation mechanism 2 includes a movable part 21 and an elevation motor 22 that drives the movable part 21. The movable part 21 has a columnar shape. In a state where the movable part 21 is at the lowest position, most part of the movable part 21 is housed in the base 1. The movable part 21 elevates to project upward from a ceiling portion 11e of the base 1. The arm 3 is coupled to an upper end portion 21a of the movable part 21 to be rotatable horizontally. As indicated by solid lines and chain double-dashed lines in FIG. 1, when the movable part 21 moves upward and downward, the arm 3 and the hands 8 move upward and downward accordingly.

A joint between the arm 3 and the base 1, that is, the upper end 21a of the movable part 21, is closest to the first side portion 11a of the side portions. That is, the upper end 21a of the movable part 21 is shifted from the center of the base 1 toward the first side portion 11a in a plan view.

Each of the links 30 of the arm 3 has a shape elongated in a predetermined longitudinal direction. Hereinafter, unless otherwise specified, an end of each link 30 in the longitudinal direction will be referred to as a first end and the other end of the link 30 opposite to the first end in the longitudinal direction will be referred to as a second end. In the case of distinguishing the three links 30, the links 30 are referred to as a first link 31, a second link 32, and a third link 33 in the order from the side close to the base 1. The first link 31 is the link 30 coupled to the base 1. The hands 8 are coupled to the third link 33.

A first end 31a of the first link 31 is coupled to the base 1 to be rotatable about a first axis L1 extending in the vertical direction. Specifically, the first end 31a is coupled to the upper end 21a of the movable part 21. That is, the first end 31a is a joint portion of the arm 3 coupled to the base 1. A first end 32a of the second link 32 is coupled to a second end 31b of the first link 31 to be rotatable about a second axis L2 extending in the vertical direction. A first end 33a of the third link 33 is coupled to a second end 32b of the second link 32 to be rotatable about a third axis L3 extending in the vertical direction. The first axis L1, the second axis L2, and the third axis L3 are parallel. The length (i.e., dimension in the longitudinal direction) of the first link 31 is the largest among those of the three links 30.

The robot 100 includes two hands 8, that is, a first hand 8A and a second hand 8B (see FIG. 1). When the first hand 8A and the second hand 8B are not distinguished from each other, each of the first hand 8A and the second hand 8B is referred to simply as the "hand 8." The first hand 8A and the second hand 8B have the same basic configuration. In FIG. 2, two hands 8 overlap each other in the vertical direction, and thus, only one hand 8 is shown apparently.

Each hand 8 is coupled to the second end 33b of the third link 33 to be rotatable about a fourth axis L4 extending in the vertical direction. The fourth axis L4 is parallel to the first axis L1, the second axis L2, and the third axis L3.

The first link 31, the second link 32, the third link 33, the first hand 8A, and the second hand 8B are stacked from the bottom in this order and are not in contact with one another. The first link 31, the second link 32, the third link 33, and the two hands 8 rotate horizontally without interference with one another.

The robot 100 also includes motors 6 that drive and rotate the links 30 and the hand 8. The motors 6 include a first motor 61 for driving and rotating the first link 31, a second motor 62 for driving and rotating the second link 32, a third motor 63 for driving and rotating the third link 33, a fourth motor 64 for driving and rotating the first hand 8A, and a fifth motor 65 for driving and rotating the second hand 8B. When the first motor 61, the second motor 62, the third motor 63, the fourth motor 64, and the fifth motor 65 are not distinguished from one another, each of these motors is referred to simply as the "motor 6." Each of the motors 6 is, for example, an electric motor, and specifically a servo motor. Each motor 6 includes an encoder 6a for detecting a rotation position or a rotation amount of the rotation shaft.

Each of the links 30 has a hollow shape and has an internal space. The motor 6 is housed in the internal space of the link 30. Specifically, the first motor 61 and the second motor 62 are housed in the internal space of the first link 31. The third motor 63 is housed in the internal space of the second link 32. The fourth motor 64 and the fifth motor 65 are housed in the internal space of the third link 33. Each of the links 30 includes the corresponding motor 6 and a transfer mechanism (not shown) that transfers a driving force of the motor 6.

Each of the hands 8 includes a body 81 and a holder 82 coupled to the body 81 and branched into two. Each hand 8 has a plate shape. The hand 8 has a substantially Y shape when seen in the thickness direction thereof. The body 81 is rotatably coupled to the second end 33b of the third link 33. The hand 8 includes a holding actuator (not shown) such as an air cylinder. The holding actuator switches the hand 8 between a holding state and a release state.

Holding by the hand 8 can be implemented in various modes such as gripping, adsorption, placement, or fitting. In this example, the hands 8 are configured to grip the substrate S as an object. Specifically, a first claw 84 is fixed at each of the two front ends of the holder 82. The body 81 includes a movable second claw 85 and a holding actuator 86 that drives the second claw 85.

The holding actuator 86 is an air cylinder including a sleeve 86a and a rod 86b that advances and retreats from the sleeve 86a. The second claw 85 is coupled to the rod 86b. A pipe for supplying compressed air to the air cylinder is provided in the arm 3. The pipe is provided with a solenoid valve 88 (see FIG. 1). The solenoid valve 88 controls air supply.

When the rod 86b advances from the sleeve 86a, the second claw 85 moves toward the first claw 84. On the other hand, when the rod 86b retracts into the sleeve 86a, the second claw 85 moves away from the first claw 84. When the second claw 85 is advanced with the substrate S located between the first claw 84 and the second claw 85, the first claw 84 and the second claw 85 are engaged with an edge of the substrate S. Accordingly, the hands 8 hold the substrate S. The second claw 85 in this state is then retracted so that the second claw 85 thereby moves away from the edge of the substrate S. Accordingly, the hands 8 release the substrate S.

The body 81 is provided with an operation sensor 87 that detects an operation of the second claw 85. The operation sensor 87 is a contact or non-contact type sensor, and detects operation of the second claw 85 by detecting operation of a detection target that moves together with the second claw 85 or the rod 86b.

Although not shown, the hands 8 are also provided with another sensor other than the operation sensor 87. For example, a mapping sensor that detects a state of a semiconductor wafer in the FOUP 121A can be provided at the front end of the holder 82. A sensor that detects the presence of a semiconductor wafer on the holder 82 can be provided to the holder 82.

The base 1 houses a component related to control of at least one of the arm 3 or the hands 8 (hereinafter referred to as a "control component"). For example, the base 1 houses, for example, a first board 24 serving as an interface between sensors such as the operation sensor 87 and the solenoid valve 88, and the control device 10, a second board 25 that supplies a power supply to encoders of the motors 6, and a battery 26 that supplies electric power for retaining values of the encoders 6a while a main power supply is off, for example. The first board 24 and the second board 25 are printed boards. The second board 25 supplies electric power from the battery 26 to the encoders 6a. The elevation motor 22 is also a control component.

As illustrated in FIG. 3, in the front-rear direction in the casing 111, the base 1 is closer to the first side wall 111a than the third side wall 111c, that is, is offset toward the first side wall 111a from the center of the casing 111. In the left-right direction, the base 1 is disposed at substantially the center of the casing 111. As described above, the base 1 is offset toward the first side wall 111a from the center of the casing 111 in the front-rear direction so that the length of each of the links 30 is increased, and thereby, a movable range of the hands 8 is enlarged.

At this time, the first side portion 11a of the base 1 faces the first side wall 111a. Accordingly, a joint between the arm 3 and the base 1 is disposed closer to the first side wall 111a.

As a result, the length of each link 30 can be further increased so that the movable range of the hands 8 is further enlarged.

With such arrangement, the second side portion 11b of the base 1 faces the second side wall 111b, the third side portion 11c of the base 1 faces the third side wall 111c, and the fourth side portion 11d of the base 1 faces the fourth side wall 111d.

FIG. 3 is a functional block diagram of the robot 100. The control device 10 includes a controller 101 that controls the entire robot 100, a storage 102 that stores various programs and various types of data, a memory 103, an interface 104 connected to, for example, the motors 6, and a power supply 105 that supplies electric power to components. The control device 10 is disposed outside the casing 111.

The storage 102 is a recording medium readable by a computer, and is constituted by, for example, a flash memory. The storage 102 may also be constituted by, for example, an optical disk such as a CD-ROM. The storage 102 stores various programs and various types of data necessary for executing processing of the controller 101.

The controller 101 controls, for example, the motors 6 based on programs stored in the storage 102. The controller 101 is constituted by, for example, a processor such as a central processing unit (CPU). The controller 101 executes various types of processing by developing programs stored in, for example, the storage 102 in the memory 103 to thereby execute processing. The controller 101 may be implemented by hardware such as large scale integration (LSI) having a function similar to that of a processor.

The elevation motor 22, the first motor 61, the second motor 62, the third motor 63, the fourth motor 64, and the fifth motor 65 are connected to the interface 104. The first board 24 and the second board 25 are also connected to the interface 104. A fan 18 is connected to the interface 104. The sensors such as the operation sensor 87 and the solenoid valve 88, for example, are connected to the first board 24. The battery 26 and the encoders 6a are connected to the second board 25.

The control device 10 controls the motors 6 and other components based on a predetermined operation program or an operation command input from a user to control the robot 100. The control device 10 displaces the arm 3 by controlling the elevation motor 22 and/or the motors 6. The control device 10 causes the hands 8 to hold or release the substrate S by controlling the solenoid valve 88 through the first board 24. At this time, the control device 10 has received a detection result of the operation sensor 87. The control device 10 controls the second board 25 to supply electric power to the encoders 6a. While the main power supply of the main robot 100 is off, the second board 25 supplies electric power to the encoders 6a to maintain the values of the encoders 6a.

For example, the control device 10 displaces the arm 3 and the hand 8 so that the hand 8 enters the internal space of the FOUP 121A (see solid lines in FIG. 3). Then, the control device 10 causes the hand 8 to hold the substrate S in the FOUP 121A. The control device 10 causes the hand 8 holding the substrate S to retract from the FOUP 121A to the transfer space 112 and then to enter the processor 121B (see chain double-dashed lines in FIG. 3). The control device 10 causes the hand 8 to release the substrate S at a predetermined position in the processor 121B. Thereafter, the control device 10 causes the hand 8 to temporarily retract from the processor 121B. The processor 121B performs predetermined processing on the substrate S. After the processing on the substrate S, the control device 10 causes the hands 8 to enter the processor 121B and hold the substrate S. The control device 10 causes the hands 8 holding the substrate S to retract from the processor 121B to the transfer space 112 and then to enter the FOUP 121A. The control device 10 causes the hand 8 to release the substrate S at a predetermined position in the FOUP 121A. In the manner described above, the control device 10 causes the robot 100 to transfer the substrate S between the FOUP 121A and the processor 121B.

Figure 5:
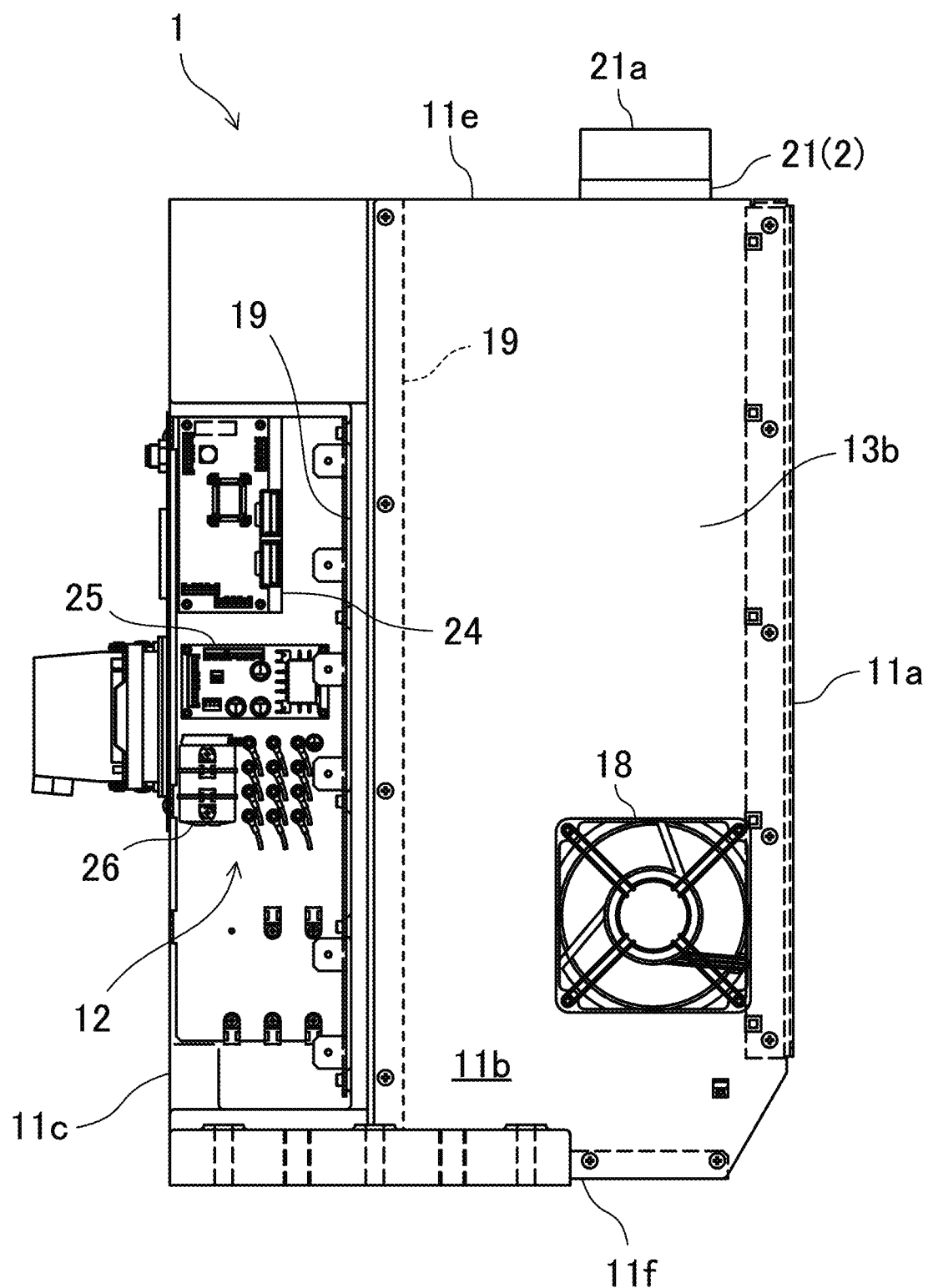
FIG. 5 is a side view of a base with a first cover detached.

FIG. 5 is a side view of the base 1, and illustrates a state where the first cover 13a is detached. In the thus-configured robot 10 as illustrated in FIGS. 1 and 5, the second side portion 11b of the base 1 is provided with a maintenance area 12 for performing maintenance on at least one of the control components (hereinafter referred to as a "maintenance component"). A maintenance component is disposed on the maintenance area 12. The maintenance area 12 is provided to perform maintenance of a component without moving the base 1, that is, while leaving the base 1 at the same place. The maintenance component is a component that is a subject of such maintenance.

For example, the maintenance component is a component which is frequently maintained. The maintenance component is, for example, an electric component. In this example, the first board 24, the second board 25, and the battery 26 are placed on the maintenance area 12 as maintenance components.

The maintenance area 12 is disposed in a portion of the second side portion 11b relatively close to the third side portion 11c. The first cover 13a covering the maintenance area 12 is detachably attached to the second side portion 11b (see FIG. 1). The first cover 13a is attached to a frame 19 of the base 1. When the first cover 13a is detached, the maintenance area 12 appears. The first cover 13a is an example of a cover.

Since the joint between the arm 3 and the base 1 is close to the first side portion 11a, the elevation mechanism 2 is disposed in a portion of the inside of the base 1 close to the first side portion 11a. Thus, in the base 1, a portion close to the third side portion 11c has a margin for space than a portion close to the first side portion 11a. A portion of the second side portion 11b close to the third side portion 11c also has a margin for space for placing the maintenance area 12.

In the second side portion 11b, a second cover 13b is attached to the frame 19, as well as the first cover 13a. The second cover 13b covers a portion of the second side portion 11b close to the first side portion 11a. When the second cover 13b is detached, components (e.g., the elevation mechanism 2) other than the maintenance components are exposed. To perform maintenance on these components, the second cover 13b is detached. In the case of performing maintenance with the second cover 13b detached, the base 1 is moved from the current place to a place where maintenance is to be performed.

The base 1 includes the fan 18 for discharging air in the base 1 to the outside of the base 1. While the elevation mechanism 2 lifts or lowers the movable part 21, the fan 18 discharges air in the base 1 in order to smoothly lift and lower the movable part 21. The fan 18 is provided to each of the second side portion 11b and the fourth side portion 11d. Although the fan 18 at the fourth side portion 11d is not shown, the fan 18 at the second side portion 11b is attached to a portion of the second side portion 11b except for the first cover 13a, specifically, to the second cover 13b.

As illustrated in FIG. 3, the second side portion 11b faces the second side wall 111b of the casing 111. The second side wall 111b is provided with an opening/closing part 114 for performing maintenance on the robot 100. Specifically, the second side wall 111b has an opening 114a, and is provided with a door for opening and closing the opening 114a as the opening/closing part 114. The opening 114a is large enough to allow an operator to pass therethrough.

When an operator performs maintenance on maintenance components such as the first board 24 of the robot 100, the operator opens the opening/closing part 114 to enter the inside of the casing 111. Then, the operator detaches the first cover 13a to expose the maintenance area 12. Thereafter, the operator performs necessary maintenance on the maintenance components.

As described above, the maintenance area 12 is provided to the second side portion 11b that is one of side portions of the base 1 except for the first side portion 11a close to the side wall of the casing 111 and that faces the second side wall 111b provided with the opening/closing part 114. Accordingly, maintainability of the robot 100 can be enhanced.

Specifically, to enlarge a movable range of the arm 3 and the hands 8 in the limited transfer space 112 of the casing 111, the robot 100 is disposed such that the joint between the arm 3 and the base 1 is disposed close to the first side wall 111a. In addition, the base 1 is disposed such that the first side portion 11a that is one of the side portions of the base 1 closest to the joint between the arm 3 and the base 1 faces the first side wall 111a. Since the first side portion 11a is close to the first side wall 111a of the casing 111, if the maintenance components are disposed at the first side portion 11a, it is difficult to obtain a space for maintenance.

As a result of such arrangement of the base 1, the second side portion 11b faces the second side wall 111b of the casing 111. The second side wall 111b is provided with the opening/closing part 114 for performing maintenance on the robot 100. The second side portion 11b is provided with the maintenance area 12 so that an operator who has entered the inside of the casing 111 from the opening/closing part 114 can easily access the maintenance area 12. As a result, maintainability of the maintenance components of the robot 100 can be enhanced.

In particular, since the casing 111 has a substantially rectangular shape elongated in the left-right direction in a plan view, a space is narrow in the front-rear direction. On the other hand, a space is present at the left and right of the base 1. The presence of the maintenance area 12 at the second side portion 11b of the base 1 can obtain a space for maintenance in the casing 111. That is, the space at the left and right of the base 1 can be effectively used for performing maintenance.

In another aspect, the presence of the maintenance area 12 at the second side portion 11b facing the second side wall 111b eliminates the necessity for obtaining spaces for maintenance at the front and rear of the base 1. Consequently, the size of the casing 111 can be reduced in the front-rear direction. As a result, the size of the substrate transfer system 110 can also be reduced.

In addition, the second side portion 11b is provided with the fan 18 in order to discharge air from the second side portion 11b to the outside. If the fan 18 is attached to the first cover 13a, the fan 18 moves together with the first cover 13a when the first cover 13a is detached. Wires are connected to the fan 18. Since the detached first cover 13a is integrated with the fan 18 and the wires, handling of the first cover 13a is complicated. On the other hand, the first cover 13a does not cover the entire surface of the second side portion 11b but covers a part of the second side portion 11b including the maintenance area 12, and the fan 18 is provided to a portion except for the first cover 13a, that is, to the second cover 13b. Accordingly, the first cover 13a can be detached with the fan 18 remaining without change. As a result, the first cover 13a can be easily handled, and maintainability is further enhanced.

As described above, the robot 100 includes: the base 1 including the side portions; the arm 3 rotatably coupled to the base 1; and the hands 8 (end effectors) coupled to the arm 3. The first end 31a of the first link 31 and the upper end 21a of the movable part 21 (joint between the arm and the base) are closest to the first side portion 11a that is one of the side portions in a plan view. The base 1 houses control components (components related to control of at least one of the arm or the end effectors). The second side portion 11b that is not parallel to the first side portion 11a of the side portions is provided with the maintenance area 12 for performing maintenance on the maintenance component. The maintenance area 12 includes a maintenance component such as the first board 24 (at least one of the components related to control).

In this configuration, the base 1 houses control components. A maintenance component of the control components is disposed on the maintenance area 12 at in the second side portion 11b of the base 1. The joint between the arm 3 and the base 1 is disposed close to the first side portion 11a. The thus-configured robot 100 can be placed and used in a state where the first side portion 11a faces and is close to the boundaries (e.g., side walls of the casing 111) defining spaces. Such placement can increase the length of the arm 3 (the length of each link 30 in the case where the arm 3 is formed by links 30) and enlarge a movable range of the arm 3. In the robot 100 that can be used in such placement, the first side portion 11a can be close to, for example, the side wall of the casing 111, and thus, it is difficult to obtain a space in a place facing the first side portion 11a. On the other hand, the second side portion 11b provided with the maintenance area 12 is not parallel to the first side portion 11a but faces in a direction different from the first side portion 11a. Thus, a space can be easily obtained in a place facing the second side portion 11b. That is, a space for maintenance by the maintenance area 12 can be easily obtained. As a result, maintainability of the robot 100 in a limited space can be enhanced.

In regard to the substrate transfer system 110, the substrate transfer system 110 includes the casing 111 and the robot 100 disposed in the casing 111 and configured to transfer the substrate S. The casing 111 includes the first side wall 111a and the third side wall 111c opposed to each other in the front-rear direction (predetermined first direction), and the second side wall 111b and the fourth side wall 111d opposed to each other in the left-right direction (second direction) different from the front-rear direction. The second side wall 111b is provided with the opening/closing part 114 for maintenance of the robot 100. The robot 100 includes the base 1 having the side portions, the arm 3 rotatably coupled to the base 1, and the hands 8 (end effectors) coupled to the arm 3. The base 1 houses the control components (components related to control of at least one of the arm or the end effectors), and is closer to the first side wall 111a than the third side wall 111c. The first side portion 11a that is one of the side portions of the base 1 faces the first side wall 111a. The second side portion 11b facing the second side wall 111b of the side portions of the base 1 is provided with the maintenance area 12 for maintenance of the maintenance component. The maintenance component (at least one of components related to control) such as the first board 24 is disposed on the maintenance area 12.

In this configuration, the robot 100 is disposed in the casing 111, and the base 1 is disposed close to the first side wall 111a of the casing 111. The base 1 houses control components. The maintenance component in the control components is disposed on the maintenance area 12 provided at the second side portion 11b of the base 1. The second side portion 11b faces the second side wall 111b of the casing 111. The second side wall 111b is provided with the opening/closing part 114 for maintenance of the robot 100. Thus, an operator can easily access the maintenance area 12 of the base 1 to perform maintenance of the maintenance component by opening the opening/closing part 114 of the casing 111. As a result, maintainability of the robot 100 can be enhanced in a limited space of the casing 111. In addition, since it is unnecessary to provide spaces for maintenance at the front and rear of the base 1, size of the casing 111 in the front-rear direction can be reduced.

The casing 111 has a quadrilateral shape in a plan view.

In addition, a distance between the second side wall 111b and the fourth side wall 111d is larger than a distance between the first side wall 111a and the third side wall 111c.

In this configuration, since the space in the casing 111 is longer in the left-right direction than in the front-rear direction, pace can be easily obtained at the left and right of the base 1. The second side portion 11b faces the second side wall 111b, that is, in the left-right direction. Thus, maintenance of the maintenance component can be performed by using the space at the left and right of the base 1. As a result, the space in the casing 111 can be effectively utilized to enhance maintainability.

The first end 31a of the arm 3 and the upper end 21a of the movable part 21 (i.e., joint between the arm and the base 1) are closest to the first side portion 11a of the side portions.

In this configuration, since the first side portion 11a faces the first side wall 111a of the casing 111 close to the base 1, the first end 31a of the arm 3 is close to the first side wall 111a. As a result, the length of the arm 3 (the length of each link 30 in the case where the arm 3 is formed by the links 30) is increased so that a movable range of the arm 3 can be enlarged.

The side portions of the base 1 include the first side portion 11a, the second side portion 11b, the third side portion 11c opposed to the first side portion 11a, and the fourth side portion 11d opposed to the second side portion 11b. The base 1 has a quadrilateral shape in a plan view.

In this configuration, the base 1 gas a substantially quadrilateral shape surrounded by the first side portion 11a and the third side portion 11c opposed to each other and the second side portion 11b and the fourth side portion 11d opposed to each other, in a plan view.

In addition, components disposed on the maintenance area 12 are electric components.

Maintenance such as replacement of electric components are easier than that of mechanical components. Thus, maintenance can be easily performed on components on the The base 1 includes the fan 18 disposed at the second side portion 11b and configured to discharge air in the base 1. The first cover 13a (cover) covering the maintenance area 12 is detachably attached to the second side portion 11b. The fan 18 is disposed in a portion of the second side portion 11b except for the first cover 13a.

In this configuration, in performing maintenance in the maintenance area 12, the first cover 13a is detached. Since the fan 18 is disposed in a portion except for the first cover 13a, even when the first cover 13a is detached, the fan 18 remains in the second side portion 11b. Accordingly, the first cover 13a can be easily handled, and maintainability is enhanced.

As end effectors, the hands 8 for holding the substrate S are employed.

In this configuration, the robot 100 transfers the substrate S. The substrate S is transferred in a cleaned space such as the casing 111 in many cases. That is, the robot 100 is often used in a limited space. In such a situation, enhancement of maintainability with the configuration described above is especially effective.

The FOUPs 121A (enclosures) for housing semiconductor wafers are disposed adjacent to the first side wall 111a (one of the first side wall and the third side wall). The processors 121B for processing semiconductor wafers are disposed adjacent to the third side wall 111c (the other of the first side wall and the third side wall). The hands 8 hold a semiconductor wafer as the substrate S. The robot 100 transfers the semiconductor wafer between the FOUPs 121A and the processors 121B.

In this configuration, since handling of semiconductor wafers requires a cleaned environment, the robot 100 is used in a limited space such as the casing 111. In such a situation, enhancement of maintainability with the configuration described above is especially effective.

Other Embodiments

In the foregoing section, the embodiment has been described as an example of the technique disclosed in the present application. The technique disclosed here, however, is not limited to this embodiment, and is applicable to other embodiments obtained by changes, replacements, additions, and/or omissions as necessary. Components described in the embodiment described above may be combined as a new exemplary embodiment. Components provided in the accompanying drawings and the detailed description can include components unnecessary for solving problems as well as components necessary for solving problems in order to exemplify the technique. Therefore, it should not be concluded that such unnecessary components are necessary only because these unnecessary components are included in the accompanying drawings or the detailed description.

For example, although the robot 100 is incorporated in the substrate transfer system 110, the present disclosure is not limited to this example. The robot 100 is not limited to use in an environment that is clean enough to enable processing of a semiconductor. The robot 100 may be incorporated in, for example, a production line. It should be noted that the robot 100 is used in a limited space such as the casing 111.

The substrate transfer system 110 may not be incorporated in the substrate processing apparatus 120. That is, the substrate transfer system 110 can have any configuration as long as the robot 100 transfers the substrate S in the casing 111. The origin and destination of transfer of the substrate S are not limited to the FOUPs 121A and the processors 121B.

The substrate S can be a thin film that can be a material for a substrate of a semiconductor device, such as a semiconductor substrate or a glass substrate. Examples of the semiconductor substrate include a silicon substrate and a sapphire substrate. Examples of the glass substrate include a glass substrate for a flat panel display (FPD) and a glass substrate for a micro electro mechanical systems (MEMS).

The FOUPs 121A may be adjacent to the first side wall 111a, and the processors 121B may be adjacent to the third side wall 111c. In addition, the FOUPs 121A or the processors 121B may also be adjacent to the second side wall 111b or the fourth side wall 111d.

The configuration of the casing 111 is not limited to the configuration described above. The casing 111 may have a shape other than a quadrilateral shape in a plan view. For example, the casing 111 may include one or more other side walls in addition to the first side wall 111a and the third side wall 111c opposed to each other and the second side wall 111b and the fourth side wall 111d opposed to each other. For example, the first side wall 111a and the second side wall 111b may not be directly combined with each other and may be combined with each other through one or more other side walls. Even in a case where the casing 111 has a substantially quadrilateral shape in a plan view, a distance between the first side wall 111a and the third side wall 111c may be larger than a distance between the second side wall 111b and the fourth side wall 111d.

The direction in which the first side wall 111a faces and the direction in which the second side wall 111b faces may intersect with each other at an angle except for 90 degrees.

The opening/closing part 114 is not limited to the door. For example, the opening/closing part 114 is detachably attached to the casing 111, and may be completely detached in uncovering the opening 114a.

The robot is not limited to the horizontal articulated robot 100. For example, the robot may be a vertical articulated robot.

The arm 3 may not be formed by the links 30. In a case where the arm 3 is divided, the number of divisions of the arm 3, that is, the number of the links 30, is not limited to 3. The arm 3 may be formed by two or four or more links 30.

In the substrate transfer system 110, the joint between the arm 3 and the base 1 may not be closest to the first side portion 11a of the side portions of the base 1. For example, the joint may be closest to the second side portion 11b of the side portions. The joint may be disposed at the center of the base 1 in a plan view.

The end effectors are not limited to the hands 8. For example, the end effectors may be coating tools or welding tools. Even in the case where the end effectors are the hands 8, an object to be held by the hand 8 is not limited to a substrate. The number of the hands 8 (i.e., the number of end effectors) is not limited to two, and may be one or three or more.

The configuration of the base 1 is not limited to the configuration described above. The base 1 may have a shape other than a quadrilateral shape in a plan view. For example, the base 1 may have one or more other side portions, in addition to the first side portion 11a and the third side portion 11c opposed to each other and the second side portion 11b and the fourth side portion 11d opposed to each other. For example, the first side portion 11a and the second side portion 11b may not be directly combined with each other, and may be combined with each other through one or more other side portions.

The direction in which the first side portion 11a faces and the direction in which the second side portion 11b faces may intersect with each other at an angle except for 90 degrees.

The maintenance area 12 can be disposed at any place in the second side portion 11b. For example, the maintenance area 12 may be disposed in a portion of the second side portion 11b close to the first side portion 11a. The maintenance area 12 may be provided at the entire second side portion 11b.

Although the maintenance area 12 is covered with the first cover 13a in the example described above, but may be exposed without the first cover 13a. The first cover 13a may be attached to the base 1 to open and close the maintenance area 12 as in a hinged door.

Components disposed on the maintenance area 12 may be components other than the first board 24, the second board 25, and the battery 26. For example, in a case where sensors provided in the hands 8 in the configuration described above, such as the operation sensors 87, are optical sensors, these sensors may be disposed on the maintenance area 12 as maintenance components. In this case, optical fibers are constructed in the arm 3 from the sensors on the maintenance area 12 to the hands 8. Accordingly, the sensors disposed on the maintenance area 12 can detect an object in the hands 8. The solenoid valve 88 may be disposed not inside the arm 3 but in the maintenance area 12 as a maintenance component.

In addition, the control device 10 may be housed in the base 1. In this case, the board including, for example, the controller 101 of the control device 10 may be disposed on the maintenance area 12 as the maintenance component. In this case, an electrolytic capacitor serving as a power supply of the control device 10 can also be housed in the base 1. The electrolytic capacitor can also be disposed on the maintenance area 12 as the maintenance component.

In a configuration in which the hand 8 holds an object by suction, a pipe for sucking air from a suction portion of the hand 8 is provided. This pipe can be provided with a solenoid valve for switching an air flow in the pipe between distribution and interruption, and a pressure sensor for detecting a pressure in the pipe. The solenoid valve or the pressure sensor may be disposed on the maintenance area 12 as the maintenance component.

INDUSTRIAL APPLICABILITY

As described above, the technique disclosed is useful for a robot and a substrate transfer system including the robot.

DESCRIPTION OF REFERENCE CHARACTERS 100 horizontal articulated robot (robot)
110 substrate transfer system
1 base
11a first side portion
11b second side portion
11c third side portion
11d fourth side portion
12 maintenance area
13a first cover (cover)
18 fan
21a upper end of movable part (joint between arm and base)
24 first board (component related to control)
25 second board (component related to control)
26 battery (component related to control)
3 arm
31a first end (joint between arm and base)
8 hand (end effector)
111 casing
111a first side wall
111b second side wall
111c third side wall
111d fourth side wall
114 opening/closing part
121A FOUP (enclosure)
121B processor
S substrate

The invention claimed is:

1. A robot comprising:
a base having side portions;
an arm rotatably coupled to the base; and
an end effector coupled to the arm,
wherein:
a joint between the arm and the base is closest to a first side portion in a plan view, the first side portion being one of the side portions,
the base houses components related to control of at least one of the arm or the end effector,
a second side portion that is not parallel to the first side portion of the side portions includes a maintenance area for access during a maintenance operation, the maintenance area including an electrical board and a battery,
the base includes a fan, the fan being disposed at the second side portion and configured to discharge air in the base,
the robot further comprising:
a first cover to cover the maintenance area, the first cover being detachably attached to the second side portion; and
a second cover attached to the second side portion, the fan is disposed at a hole in the second cover.

2. The robot according to claim 1, wherein:
the side portions of the base include the first side portion, the second side portion, a third side portion opposed to the first side portion, and a fourth side portion opposed to the second side portion, and
the base has a quadrilateral shape in a plan view.

3. The robot according to claim 1, wherein:
the end effector is a hand configured to hold a substrate.

4. The robot according to claim 3, wherein:
the hand holds a semiconductor wafer as the substrate, and
the arm and the hand transfer the semiconductor wafer between an enclosure configured to house the semiconductor wafer and a processor configured to process the semiconductor wafer.

5. The robot according to claim 1, wherein:
the first cover and the second cover are in a same plane.

6. A substrate transfer system comprising:
a casing; and
a robot disposed in the casing and configured to transfer a substrate,
wherein:
the casing includes a first side wall and a third side wall opposed to each other in a predetermined first direction, and a second side wall and a fourth side wall opposed to each other in a second direction different from the first direction,
the second side wall includes an opening/closing part for maintenance on the robot,
the robot includes a base having side portions, an arm rotatably attached to the base, and an end effector coupled to the arm,
the base houses components related to control of at least one of the arm or the end effector, and is closer to the first side wall than the third side wall,
a first side portion that is one of the side portions of the base faces the first side wall, and
a second side portion facing the second side wall in the side portions of the base includes a maintenance area for access during a maintenance operation, the maintenance area including an electrical board and a battery,
the base includes a fan, the fan being disposed at the second side portion and configured to discharge air in the base,
the robot further comprising:
a first cover to cover the maintenance area, the first cover being detachably attached to the second side portion; and
a second cover attached to the second side portion, the fan is disposed at a hole in the second cover.

7. The substrate transfer system according to claim 6, wherein:
the casing has a quadrilateral shape in a plan view.

8. The substrate transfer system according to claim 6, wherein:
a distance between the second side wall and the fourth side wall is larger than a distance between the first side wall and the third side wall.

9. The substrate transfer system according to claim 6, wherein:
a joint between the arm and the base is closest to the first side portion of the side portions in a plan view.

10. The substrate transfer system according to claim 6, wherein:
the side portions of the base include the first side portion, the second side portion, a third side portion opposed to the first side portion, and a fourth side portion opposed to the second side portion, and
the base has a quadrilateral shape in a plan view.

11. The substrate transfer system according to claim 6, wherein:
the end effector is a hand configured to hold a substrate.

12. The substrate transfer system according to claim 11, wherein further comprising:
an enclosure configured to house a semiconductor wafer is adjacent to one of the first side wall and the third side wall; and
a processor configured to process the semiconductor wafer is disposed in another one of the first side wall and the third side wall,
wherein:
the hand holds the semiconductor wafer as the substrate, and
the robot transfers the semiconductor wafer between the enclosure and the processor.

13. The substrate transfer system according to claim 6, wherein:
the first cover and the second cover are in a same plane.

* * * * *